US012616057B2

(12) United States Patent
Liu et al.

(10) Patent No.: US 12,616,057 B2
(45) Date of Patent: Apr. 28, 2026

(54) DOUBLE-SIDED SIP PACKAGING STRUCTURE HAVING INTERPOSER INCLUDING A GROOVE AND MANUFACTURING METHOD THEREOF

(71) Applicant: JCET GROUP CO., LTD., Jiangsu (CN)

(72) Inventors: Shuo Liu, Jiangsu (CN); Yaojian Lin, Jiangsu (CN); Jianyong Wu, Jiangsu (CN); Wei Yan, Jiangsu (CN); Jing Zhao, Jiangsu (CN)

(73) Assignee: JCET GROUP CO., LTD., Jiangsu (CN)

( * ) Notice: Subject to any disclaimer, the term of this patent is extended or adjusted under 35 U.S.C. 154(b) by 391 days.

(21) Appl. No.: 18/486,147

(22) Filed: Oct. 12, 2023

(65) Prior Publication Data

US 2024/0128142 A1 Apr. 18, 2024

(30) Foreign Application Priority Data

Oct. 13, 2022 (CN) .......................... 202211251028.3

(51) Int. Cl.
*H10W 74/10* (2026.01)
*H10W 70/69* (2026.01)
(Continued)

(52) U.S. Cl.
CPC ......... *H10W 74/121* (2026.01); *H10W 70/69* (2026.01); *H10W 72/071* (2026.01);
(Continued)

(58) Field of Classification Search
CPC ..... H01L 21/56; H01L 21/561; H01L 21/563; H01L 21/60; H01L 23/13; H01L 23/14; H01L 23/3121; H01L 23/3128; H01L 23/3135; H01L 23/49816; H01L 23/5385; H01L 23/5386; H01L 23/552; H01L 23/562; H01L 24/05; H01L 24/06; H01L 24/13; H01L 24/14; H01L 24/17; H01L 25/0652; H01L 25/50; H01L 2225/06513; H01L 2225/06517; H10B 80/00; H10K 39/10; H10K 39/12; H10K 39/15; H10K 39/18; H10K 39/601; H10K 39/621;
(Continued)

(56) References Cited

U.S. PATENT DOCUMENTS 10,896,877 B1 * 1/2021 Yang ................... H01L 23/3128

* cited by examiner

*Primary Examiner* — Cheung Lee

(74) *Attorney, Agent, or Firm* — JCIPRNET

(57) ABSTRACT

The present application discloses a double-sided SiP packaging structure and a manufacturing method thereof, wherein the double-sided SiP packaging structure comprises a substrate, a first packaging structure arranged on the substrate, and a second packaging structure arranged below the substrate; the second packaging structure comprises a chip, a interposer and a molding material; a conductive structure array is arranged on an upper surface of the interposer; the interposer is arranged below the substrate through the conductive structure array; a space region among a lower surface of the substrate, the chip and the interposer is filled with the molding material; a conductive bonding pad array is arranged on the lower surface of the interposer; and a groove is formed in a part of region between the conductive bonding pad and an edge contour of the interposer.

20 Claims, 7 Drawing Sheets

(51) Int. Cl.
    *H10W 72/00*      (2026.01)
    *H10W 72/90*      (2026.01)
    *H10W 74/01*      (2026.01)
    *H10W 90/00*      (2026.01)
    *H10W 72/20*      (2026.01)

(52) U.S. Cl.
    CPC ........... H10W 72/90 (2026.01); H10W 74/01
        (2026.01); H10W 74/114 (2026.01); H10W
        90/701 (2026.01); *H10W 72/072* (2026.01);
        *H10W 72/244* (2026.01); *H10W 72/247*
        (2026.01); *H10W 72/252* (2026.01)

(58) Field of Classification Search
    CPC ........ H10K 59/90; H10K 59/95; H10N 19/00;
        H10N 39/00; H10N 59/00; H10N 69/00;
        H10N 79/00; H10N 89/00; H10W 70/611;
        H10W 70/614; H10W 70/616; H10W
        70/68; H10W 72/072; H10W 72/20;
        H10W 74/114; H10W 74/121; H10W
        90/701; H10W 90/722; H10W 90/724;
        H10W 90/726
    See application file for complete search history.

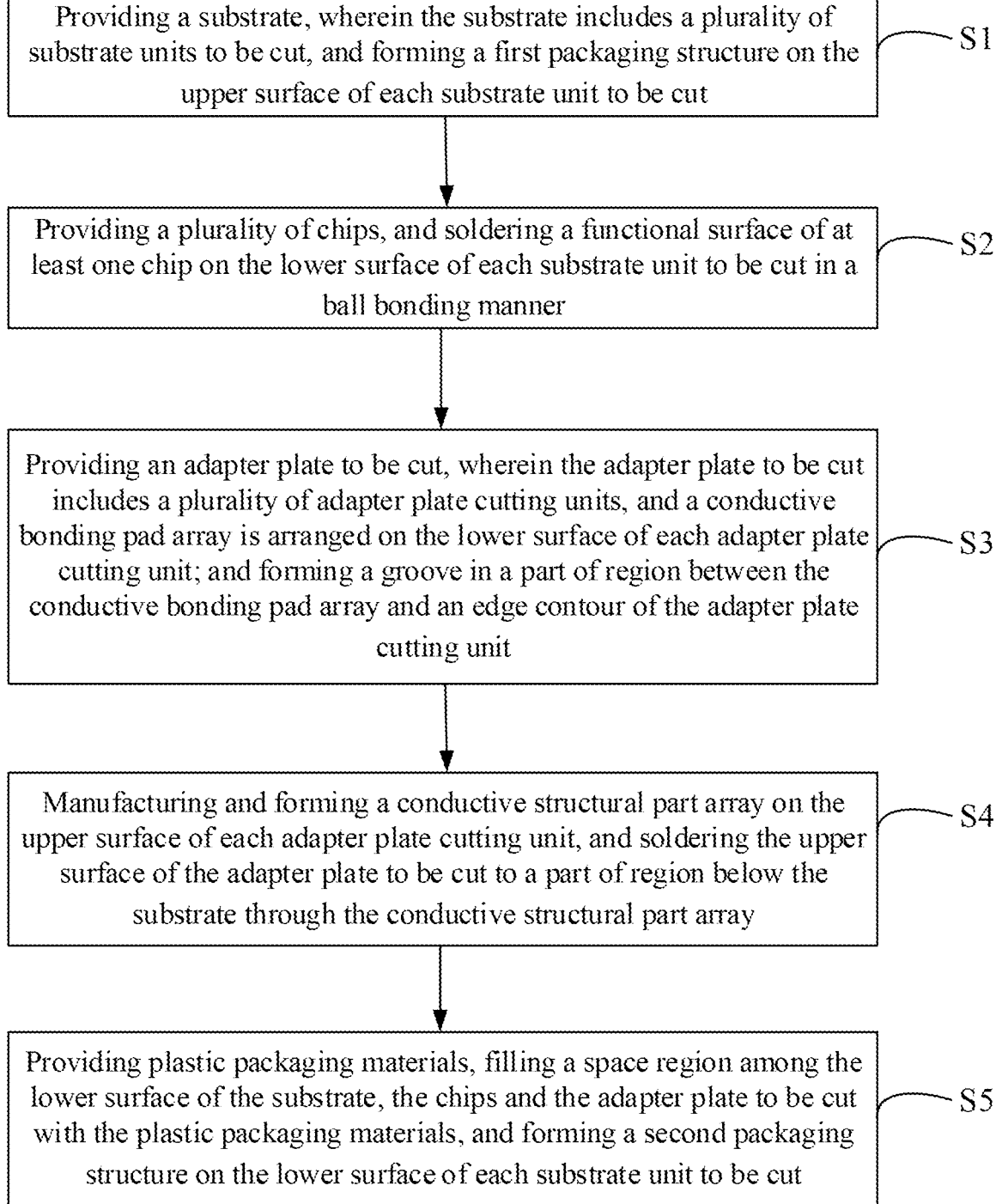

Providing a substrate, wherein the substrate includes a plurality of substrate units to be cut, and forming a first packaging structure on the upper surface of each substrate unit to be cut — S1

Providing a plurality of chips, and soldering a functional surface of at least one chip on the lower surface of each substrate unit to be cut in a ball bonding manner — S2

Providing an adapter plate to be cut, wherein the adapter plate to be cut includes a plurality of adapter plate cutting units, and a conductive bonding pad array is arranged on the lower surface of each adapter plate cutting unit; and forming a groove in a part of region between the conductive bonding pad array and an edge contour of the adapter plate cutting unit — S3

Manufacturing and forming a conductive structural part array on the upper surface of each adapter plate cutting unit, and soldering the upper surface of the adapter plate to be cut to a part of region below the substrate through the conductive structural part array — S4

Providing plastic packaging materials, filling a space region among the lower surface of the substrate, the chips and the adapter plate to be cut with the plastic packaging materials, and forming a second packaging structure on the lower surface of each substrate unit to be cut — S5

DOUBLE-SIDED SIP PACKAGING STRUCTURE HAVING INTERPOSER INCLUDING A GROOVE AND MANUFACTURING METHOD THEREOF

CROSS-REFERENCE TO RELATED APPLICATION

This application claims the priority benefit of China application serial no. 202211251028.3, filed on Oct. 13, 2022. The entirety of the above-mentioned patent application is hereby incorporated by reference herein and made a part of this specification.

BACKGROUND

Technical Field

The present invention relates to the technical field of semiconductor packaging, in particular to a double-sided system-in-package (SiP) packaging structure and a manufacturing method thereof.

Description of Related Art

With continuous development of semiconductor technology, in order to meet increasing application requirements, electronic package bodies develop towards miniaturization and micromation, so the SiP technology attracts more and more attention.

During double-sided SiP package, a chip and a solder ball structure are arranged on one side of a substrate at the same time. In general, an interposer can be used to solve a problem of height difference between the chip and the melted solder ball, which will improve the reliability, heat dissipation and ball distribution range of the packaging structure, but will also cause that the interposer is hang above a region allowed by the height of certain elements such as passive elements. When such a packaging method is adopted, adhesive overflow and other problems will easily appear in an injection molding process on one side of the interposer; and a fixed plastic packaging mold sleeve has a risk of pushing the interposer down to one side of the substrate or even pressing the interposer to the upper surface of the passive element in the injection molding process.

SUMMARY

Purposes of the present invention are to provide a double-sided SiP packaging structure and a manufacturing method thereof, so as to solve a problem that molding materials overflow and contaminate the region of conductive bonding pad on a lower surface of an interposer, and to enhance the supporting capacity of solder balls between the interposer and a substrate.

To achieve one of the above purposes of the present invention, the present invention provides a double-sided SiP packaging structure, which includes a substrate, a first packaging structure arranged on an upper surface of the substrate, and a second packaging structure arranged on a lower surface of the substrate, wherein the first packaging structure includes at least one chip soldered on the upper surface of the substrate; the second packaging structure includes at least one interposer and a molding material; the chip is arranged below the substrate and electrically connected with the substrate; a conductive structure array is arranged on the upper surface of the interposer; the interposer is arranged in a part of region below the substrate with the conductive structure array; and a space region among the lower surface of the substrate, the chip and the interposer is filled with the molding material, wherein a conductive bonding pad array is arranged on the lower surface of the interposer; and a groove is formed in a part of region between the conductive bonding pad and an edge contour of the interposer.

Optionally, the groove forms a square or annular structure around the conductive bonding pad array.

Optionally, the conductive structure array is an array composed of solder balls; structural supports are arranged in part of the solder balls; and a structural strength of the structural supports is higher than that of the solder balls.

Optionally, the structural supports are copper core balls.

Optionally, at least one circle of conductive structure arrays with the copper core balls is arranged around the chip.

Optionally, every two adjacent circles of conductive structure arrays with the copper core balls are staggered at intervals when at least two circles of conductive structure arrays with the copper core balls are arranged around the chip.

Optionally, two interposers are provided; and one chip is provided. The two interposers are respectively arranged on both sides of the chip; a groove is arranged in a region between the conductive bonding pad array on the lower surface of the interposer and an edge contour of the interposer; and the groove forms a square or annular structure around the conductive bonding pad array.

Optionally, one interposer is provided; and one chip is provided. An opening is arranged in the interposer; the chip is arranged in the opening; a first groove is formed in a region between the conductive bonding pad array and an outer edge contour of the interposer; a second groove is formed in a region between the conductive bonding pad array and the edge contour of the opening; and the first groove and the second groove are respectively enclosed to form a square or annular structure.

Optionally, the second packaging structure further includes a plurality of passive elements arranged on the lower surface of the substrate; the lower surface, provided with the passive elements, of the substrate depresses inwards to expose a conductive layer; and the passive elements are arranged on the conductive layer.

Optionally, the lower surface of the chip and the lower surface of the interposer are located at a same level; and the molding material exposes the lower surface of the chip.

Optionally, the second packaging structure includes two chips, i.e., a first chip arranged on the lower surface of the substrate and a second chip arranged on the lower surface of the first chip.

Optionally, the double-sided SiP packaging structure further includes a circuit board; and the conductive bonding pad array on the lower surface of the interposer is arranged on the upper surface of the circuit board through metal solder balls and electrically connected with the circuit board.

The present invention further provides a manufacturing method of the double-sided SiP packaging structure, including the following steps:

S1: providing a substrate, wherein the substrate includes a plurality of substrate units to be cut, and forming a first packaging structure on the upper surface of each substrate unit;

S2: providing a plurality of chips, and solder bonding a functional surface of at least one chip on the lower surface of each substrate unit by ball bonding;

S3: providing at least one interposer, wherein the interposer includes a plurality of interposer units, and a conductive bonding pad array is arranged on the lower surface of each interposer unit; and forming a groove in a part of region between the conductive bonding pad array and an edge contour of the interposer unit;

S4: manufacturing and forming a conductive structure array on the upper surface of each interposer unit, and solder bonding the upper surface of the interposer to a part of region below the substrate with the conductive structure array; and S5: providing molding materials, filling a space region among the lower surface of the substrate, the chips and the interposer with the molding materials, and forming a second packaging structure on the lower surface of each substrate unit.

Optionally, the step of forming a groove specifically includes:

forming a square or annular groove around the conductive bonding pad array.

Optionally, step S4 specifically includes:

manufacturing solder balls on the upper surface of each interposer unit to form the conductive structure array; and arranging structural supports in part of the solder balls, wherein a structural strength of the structural supports is higher than that of the solder balls;

the structural supports are copper core balls.

Optionally, the step of arranging the structural supports specifically includes:

manufacturing copper core balls in at least one circle of conductive structure arrays around the chip, wherein every two adjacent circles of conductive structure arrays with the copper core balls are staggered at intervals when the copper core balls are manufactured in at least two circles of conductive structure arrays around the chip.

Optionally, the step S3 specifically includes:

providing an interposers, wherein the interposer includes a plurality of interposer units;

forming a groove in a region between the conductive bonding pad array on the lower surface of each interposer unit and an edge contour of the interposer unit, wherein the groove forms a square or annular structure around the conductive bonding pad array; and forming a plurality of stress release holes at a joint of the two interposer units, wherein the stress release holes are connected with the upper surfaces and the lower surfaces of the interposer units.

Optionally, the step S3 specifically includes:

providing an interposer, wherein the interposer includes a plurality of interposer units, and openings are formed at positions in the interposer units corresponding to the chips;

forming a first groove in a region between the conductive bonding pad array and the edge contour of each interposer unit, and forming a second groove in a region between the conductive bonding pad array and the edge contour of each opening, wherein the first groove and the second groove are respectively enclosed to form a square or annular structure; and forming a plurality of stress release holes at the joint of the two adjacent interposer units, wherein the stress release holes are connected with the upper surfaces and the lower surfaces of the interposer units.

Optionally, before the step S3, the method further includes the following step:

providing a plurality of passive elements, wherein the lower surface, provided with the passive element, of each substrate unit depresses inwards to expose a conductive layer, and the passive elements are arranged on the conductive layers and electrically connected with the substrate units.

Optionally, the method further includes the following steps:

manufacturing metal solder balls at the conductive bonding pad array;

cutting to form a packaging unit, wherein the packaging unit includes a substrate unit to be cut, a first packaging structure and a second packaging structure; and providing a circuit board, wherein the packaging unit is soldered on the upper surface of the circuit board with the metal solder balls and electrically connected with the circuit board.

The present invention has beneficial effects that one groove is formed in a partial region of the lower surface of the interposer between the conductive bonding pad array on the lower surface of the interposer and the edge contour of the interposer, to prevent the molding materials from overflowing to the region of conductive bonding pad on the lower surface of the interposer in the molding process, and prevent the molding materials from contaminating the region of conductive bonding pad on the lower surface of the interposer.

BRIEF DESCRIPTION OF THE DRAWINGS

FIG. 7 is a flowchart of a manufacturing method of the double-sided SiP packaging structure according to an embodiment of the present invention.

DESCRIPTION OF THE EMBODIMENTS

Figure 1:
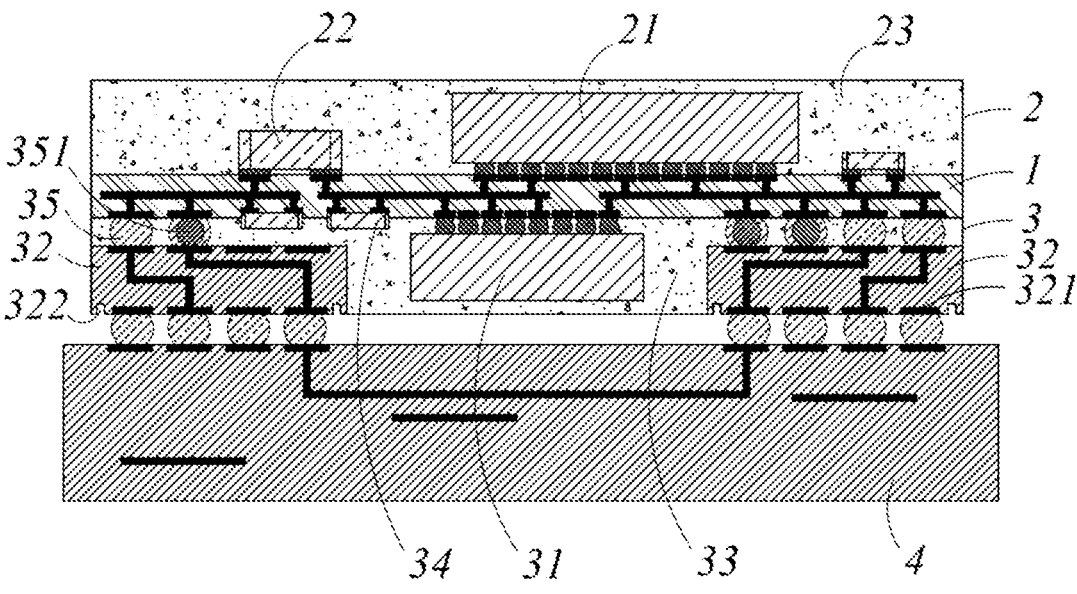
FIG. 1 is a schematic diagram of a double-sided SiP packaging structure (a chip) according to an embodiment of the present invention.

To make purposes, technical solutions and advantages of the present invention clearer, the technical solution of the present invention will be described clearly and completely in combination with embodiments of the present invention and corresponding accompanying drawings. Apparently, the described embodiments are only part of embodiments of the present invention, not all embodiments. Based on the embodiments of the present invention, all other embodiments obtained by those ordinary skilled in the field without contributing creative labor belong to a scope of protection of the present invention.

Embodiments of the present invention will be described below in detail; and examples of the embodiments will be illustrated in the accompanying drawings, wherein the same or similar reference numerals indicate the same or similar elements or elements having the same or similar functions throughout. The embodiments described below by referring to the accompanying drawings are exemplary, and can only be understood as an explanation to the present invention, rather than a limitation to the present invention.

For the convenience of description, terms indicating spatial relative positions, such as "above", "below", "behind" and "front", are used here to describe the relative relationship between one unit or feature shown in the accompanying drawings and another unit or feature. The terms indicating spatial relative positions may include different orientations of equipment in use or operation other than those shown in the accompanying drawings. For example, if a device in the accompanying drawings is turned over, it will be described as that a unit located "below" or "above" other units or features will be located "below" or "above" other units or features. Therefore, the exemplary term "below" may include two spatial orientations of upward side and downward side.

Figure 2:
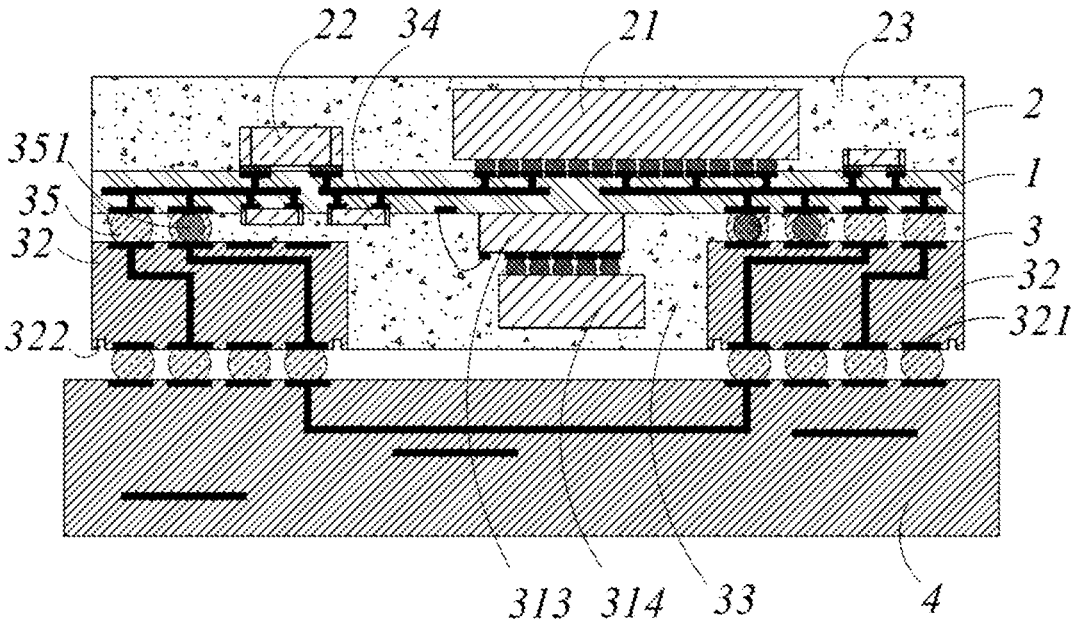
FIG. 2 is a schematic diagram of a double-sided SiP packaging structure (a mixed mounting structure of two chips) according to an embodiment of the present invention.

As shown in FIGS. 1 and 2, an embodiment of the present invention provides a double-sided SiP packaging structure, which includes a substrate 1, a first packaging structure 2 arranged on an upper surface of the substrate 1, and a second packaging structure 3 arranged on a lower surface of the substrate 1.

The upper surface and the lower surface of the substrate 1 are provided with a plurality of electrical bonding pads; the first packaging structure 2 at least includes a chip 21 flipped on the upper surface of the substrate 1; and a passive elements 22 arranged on the upper surface of the substrate 1, and a molding material 23 being arranged on the upper surface of the substrate 1 and covering the chip 21 and the passive elements 22.

The second packaging structure 3 includes at least one chip 31, at least one interposer 32 and a molding material 33, and further includes a plurality of passive elements 34.

Exemplarily, the second packaging structure 3 includes a chip 31; and the chip 31 is arranged below the substrate 1 and electrically connected with the substrate 1. Specifically, a functional surface of the chip 31 faces the lower surface of the substrate 1 and is flip bonded on the lower surface of the substrate 1 with solder balls.

Exemplarily, the second packaging structure 3 includes two chips 31, i.e., a first chip 313 arranged on the lower surface of the substrate 1 and a second chip 314 arranged on the lower surface of the first chip 313, which form a mixed chip mounting structure. Referring to FIG. 2, the first chip 313 is firstly mounted on the lower surface of the substrate 1 and is electrically connected with the substrate 1 by gold wire bonding; then, a functional surface of the second chip 314 faces the lower surface of the first chip 313; and the second chip 314 is flip bonded on the functional surface of the first chip 313 by metal ball soldering, so that the first chip 313, the second chip 314 and the substrate 1 are connected electrically. In the present embodiment, since an overall thickness of the chip mounting structure mounted on the lower surface of the substrate 1 increases, the thickness of the interposer 32 mounted on the lower surface of the substrate 1 can be adjusted accordingly, so that the lower surface of the interposer 32 is not higher than the lower surface of the second chip 314 in a height direction.

Certainly, in other embodiments of the present invention, the number, type, arrangement mode and electrical connection mode of the chips 31 are not limited in the present invention, and can be made according to actual product requirements.

Continuing to refer to FIG. 1, the passive elements 34 are arranged on the lower surface of the substrate 1; the lower surface, of the substrate 1 depresses inwards to expose a conductive layer of the substrate 1; and the passive elements 34 are arranged on the conductive layer and electrically connected with the substrate 1.

A conductive structure array 35 is arranged on the upper surface of the interposer 32; and the interposer 32 is arranged in a part of region below the substrate 1 through the conductive structure array 35. Certainly, a conductive structure is not arranged on the upper surface of the interposer 32 in the region corresponding to the passive elements 34, to prevent the conductive structure from pressing against the surfaces of the passive elements 34.

Specifically, the conductive structure array 35 is an array composed of solder balls; for part of the solder balls, structural supports 351 are set inside; a structural strength of the structural supports 351 is higher than that of the solder balls; and in the subsequent molding process, the structural supports 351 can play a certain supporting role, to prevent the interposer 32 from pressing against the passive elements 34 mounted on the lower surface of the substrate 1. Meanwhile, a height difference between the upper surface of the interposer 32 and the lower surface of the substrate 1 and a height difference between the lower surface of the interposer 32 and the lower surface of the chip 31 can be controlled and adjusted by adjusting a specific height of the structural supports 351.

In embodiments of the present invention, the structural supports 351 are copper core balls; and the copper core balls can play a certain shielding effect on radio frequency (RF) signals by matching with copper pillars used for circuit conduction inside the substrate 1 and the interposer 32, thereby protecting the chips 31 or other devices soldered on the lower surface of the substrate 1 from interference from other RF signals.

In the present invention, the specific number and arrangement mode of conductive structures with copper core balls are not specifically limited, and can be designed and adjusted according to the shielding effect required by actual products. For example, at least two conductive structures with the structural supports 351 (i.e., copper core balls) can be arranged on both sides of each passive element 34, to enhance a supporting capacity of the conductive structure array 35 near the passive element 34 and prevent the interposer 32 from pressing against the surface of the passive element 34; and at least one circle of conductive structure arrays 35 with the copper core balls can be arranged around the chips 31 or other devices with shielding requirements soldered on the lower surface of the substrate 1. If more than two circles of conductive structure arrays 35 with the copper core balls are arranged around the chips 31 or other devices with shielding requirements, every two adjacent circles of conductive structure arrays 35 with the copper core balls can be staggered at intervals to maximize the signal shielding effect.

A conductive bonding pad array 321 is arranged on the lower surface of the interposer 32; and a groove 322 is formed in a partial region of the lower surface of the interposer 32 between the conductive bonding pad array 321 and the edge contour of the interposer 32. In the subsequent injection molding process, if the molding materials overflow from an edge of the interposer 32 to the lower surface of the interposer 32, the overflowed molding materials can flow into the groove 322 to prevent the molding materials from flowing to the conductive bonding pad array 321 on the lower surface of the interposer 32 and contaminating the conductive bonding pads.

Specifically, a groove 322 is arranged in a region of the lower surface of the interposer 32 between the conductive bonding pad array 321 and the edge contour of the interposer 32; and the groove 322 forms a square or annular structure around the conductive bonding pad array 321, thereby effectively preventing the molding materials from flowing to the region of the conductive bonding pad array 321 on the lower surface of the interposer 32. Certainly, a specific shape of a closed structure formed by enclosing the groove 322 is not limited, can be a rectangular or circular structure, and can be adjusted according to specific requirements.

Further, a plurality of stress release holes are also formed in a partial region of the interposer 32 outside an inner wall surface of the groove 322; and the stress release holes are formed to connect the upper surface and the lower surface of the interposer 32, thereby releasing a mounting stress of the interposer 32 in a manufacturing process. In the present invention, specific setting dimension, number and position of the stress release holes are not limited; the stress release holes can be formed inside the groove 322, i.e., tops of the stress release holes are connected with a bottom of the groove 322; and the position of the stress release holes only needs to ensure that the stress release holes are located outside the inner wall surface of the groove 322. Meanwhile, the setting dimension and number of the stress release holes can be specifically adjusted according to the performance and thickness of different interposers.

A space region among the lower surface of the substrate 1, the chip 31 and the interposer 32 is filled with the molding material 33.

To improve a heat dissipation effect of the packaging structure, the specific height of the structural supports 351 can be adjusted so that the lower surface of the interposer 32 and the lower surface of the chip 31 are located at the same level. In the present embodiment, the molding material 33 is exposed to the lower surface of the chip 31.

Figure 3:
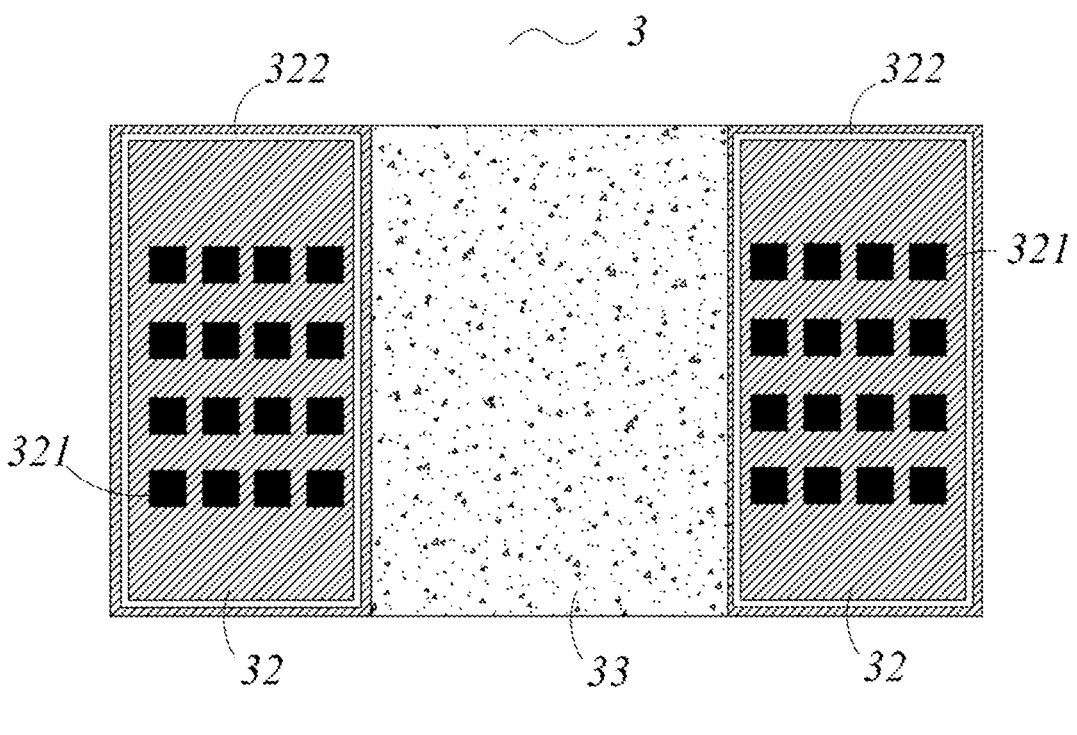
FIG. 3 is a schematic diagram of a lower surface structure of a second packaging structure according to an embodiment of the present invention.

Referring to FIG. 3, in an embodiment of the present invention, two interposers 32 are provided; and one chip 31 is provided. The two interposers 32 are respectively arranged on both sides of the chip 31; and one circle of grooves 322 and a plurality of stress release holes are formed in a region of the lower surface of the interposer 32 between the conductive bonding pad array 321 on a lower surface side of each interposer 32 and the edge contour of the interposer 32, wherein the grooves 322 form a square or annular structure around the conductive bonding pad array 321, and the plurality of stress release holes are formed in any region outside the inner wall surfaces of the grooves 322.

Figure 4:
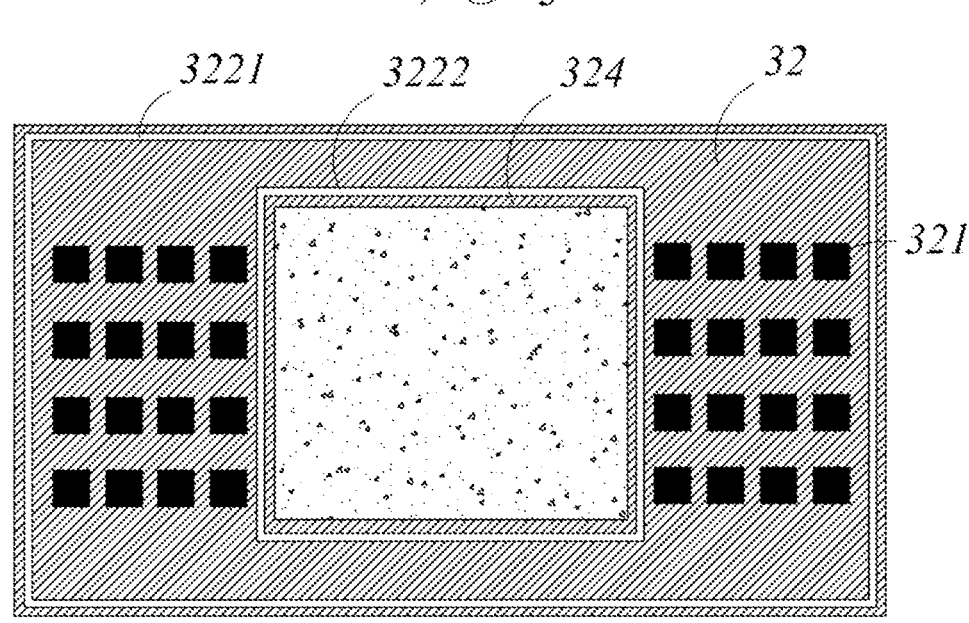
FIG. 4 is a schematic diagram of a lower surface structure of a second packaging structure according to another embodiment of the present invention.

Referring to FIG. 4, in another embodiment of the present invention, one interposer 32 provided; and one chip 31 is provided. The interposer 32 is integrally arranged, wherein an opening 324 is arranged inside the interposer 32; and the chip 31 is arranged in the opening 324. In the present embodiment, the groove 322 formed in the region of lower surface of the interposer 32 between the conductive bonding pad array 321 and the edge contour of the interposer 32 includes a first groove 3221 and a second groove 3222, i.e., the first groove 3221 is formed in the region of lower surface of the interposer 32 between the conductive bonding pad array 321 and an outer edge contour of the interposer 32, and a second groove 3222 is formed in the region of lower surface of the interposer 32 between the conductive bonding pad array 321 and the edge contour of the opening 324. The first groove 3221 and the second groove 3222 are respectively enclosed to form a square or annular structure, to prevent the molding materials from flowing to the region of conductive bonding pad on the lower surface of the interposer 32 in the injection molding process. In the injection molding process, if the molding materials overflow from the outer edge contour of the interposer 32, the molding materials can flow into the first groove 3221; and if the molding materials overflow from the edge of the opening 324 of the interposer 32, the molding materials can flow into the second groove 3222. Certainly, in the present embodiment, the stress release holes may be formed in any region outside the inner wall surface of the first groove 3221.

In other embodiments of the present invention, the specific number of interposers 32 is not limited, and can be specifically designed and adjusted according to the specific number of chips 31 mounted on the lower surface of the substrate 1 and the specific performance required by the products.

Figure 5:
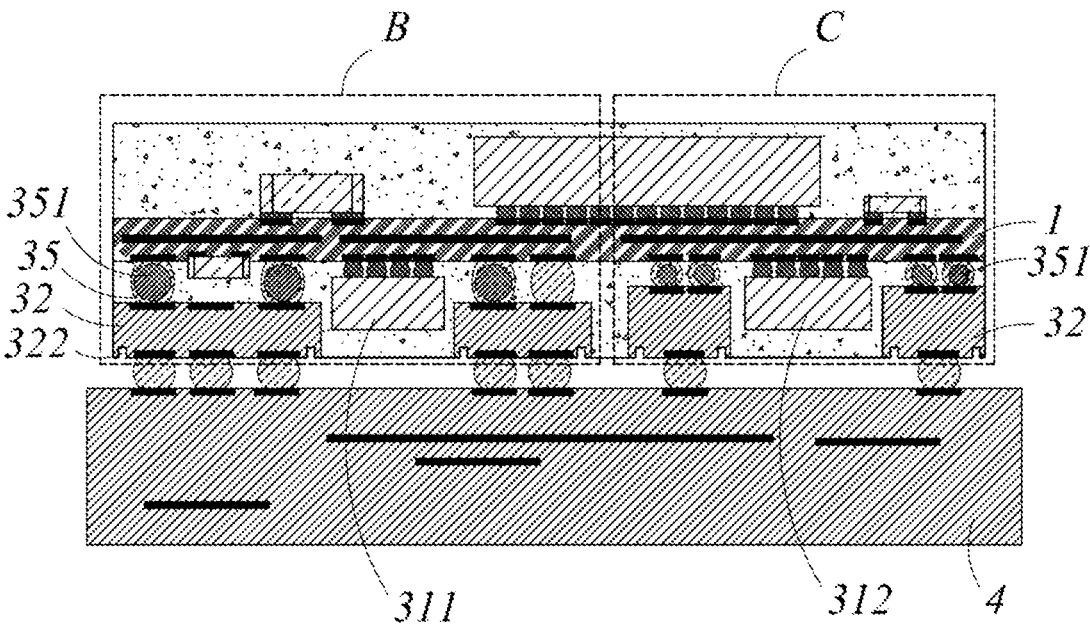
FIG. 5 is a schematic diagram of a double-sided SiP packaging structure (a plurality of chips) according to an embodiment of the present invention.
Figure 6:
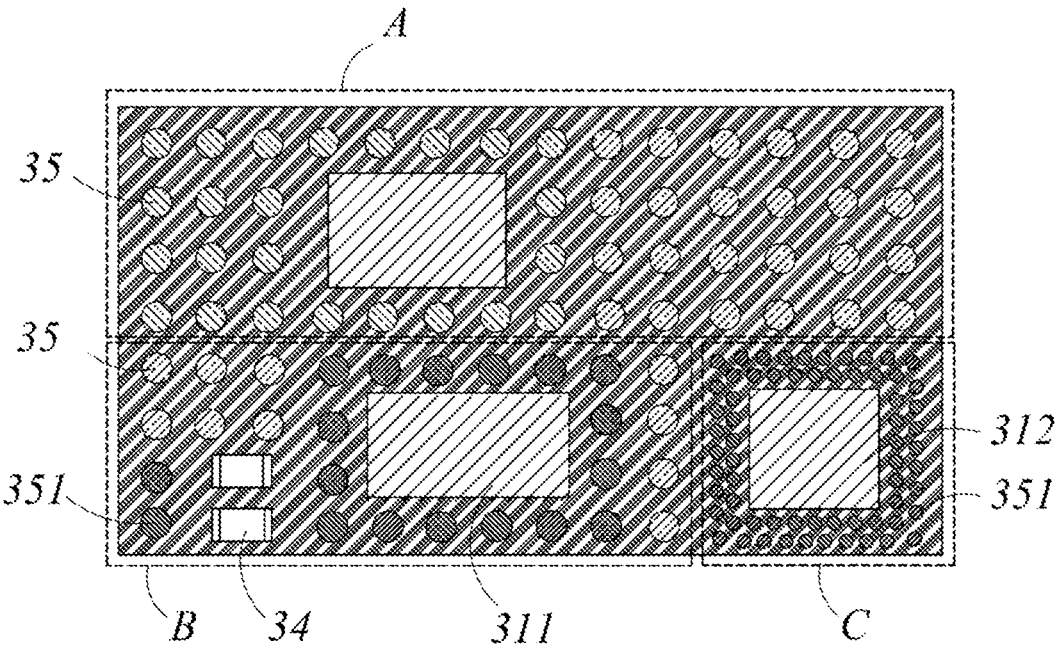
FIG. 6 is a schematic diagram of a lower surface structure of a second packaging structure in an embodiment of the present invention (a plurality of chips, excluding an interposer and a plastic packaging structure).

Exemplarily, referring to FIGS. 5 and 6 (FIG. 6 is from the perspective of the lower surface of the substrate 1, excluding the interposer 32 and the molding material 33); three chips 31 are mounted on the lower surface of the substrate 1; and the interposer is correspondingly arranged around each chip 31. In the figures, corresponding interposers are respectively mounted on regions A, B and C; three integral interposers (the interposer structure as shown in FIG. 4) can be respectively mounted on regions A, B and C; and alternatively, six split interposers (the interposer structure as shown in FIG. 3) can be mounted on the regions A, B and C correspondingly. The figures show conductive structure arrays 35 on the interposers 32; and whether structural supports 351 need to be arranged in the conductive structures and the specific number and arrangement mode of the conductive structures provided with the structural supports 351 can be designed according to specific requirements. It should be noted that, as shown in FIG. 6, the regions B and C are arranged side by side on the same side, and the region A is arranged on the other side of the whole of regions B and C. Since the structure shown in FIG. 5 is a side sectional view of the double-sided SiP packaging structure on the side where the regions B and C are located, the region A is located on a back side of regions B and C, and the region A is not shown in FIG. 5.

For example, the chip in the region A does not need the design of signal shielding structure, i.e., no copper core ball is arranged in the conductive structure array 35 around the chip in the region A in FIG. 6.

For example, one circle of conductive structure arrays 35 with the copper core balls is arranged around the chip 311 in the region B; and the structural supports 351 are arranged in the conductive structures on both sides of the passive element 34, to achieve a certain signal shielding effect while enhancing the supporting capacity of the conductive structures. Certainly, the structural supports 351 can be arranged in other conductive structures of the conductive structure array 35 in the region B.

For example, the chip 312 in the region C needs a stronger signal shielding effect; two circles of conductive structure arrays 35 with the copper core balls can be arranged around the chip 312; and the two circles of conductive structure arrays 35 with the copper core balls are staggered.

Since the substrate 1 is constant in dimension, if more circles of conductive structure arrays 35 with the copper core balls need to be arranged in a certain region, the dimension of the conductive structure arrays 35 needs to be reduced; and meanwhile, the lower surface of each interposer in the packaging structure needs to be at the same height, so the thickness of each interposer can be adjusted according to the actual design requirements, i.e., the thickness of the interposer 32 corresponding to the region C in FIG. 5 needs to be greater than that of the interposers 32 corresponding to the regions A and B to ensure that the lower surfaces of all interposers are at the same height.

Certainly, in other embodiments, the specific number and arrangement mode of the conductive structures with the copper core balls can be designed according to the signal shielding effect required by each chip or other devices mounted on the lower surface of the substrate 1. If the frequency of shielding signal increases, the ball distribution spacing and dimension of the interposers can be designed to match different thicknesses of the interposers, so as to meet the signal shielding requirement and the requirement of keeping the bottom of the overall structure flat, thereby facilitating the subsequent processes.

Further, the double-sided SiP packaging structure includes a circuit board 4; and a conductive bonding pad array 321 on the lower surface of the interposer is arranged on the upper surface of the circuit board 4 through metal solder balls and electrically connected with the circuit board 4.

Figure 8A:
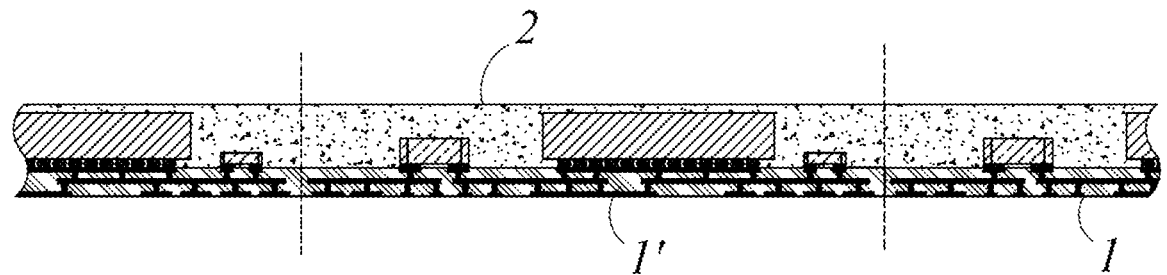
FIGS. 8A-8H are process step diagrams of the manufacturing method of the double-sided SiP packaging structure according to an embodiment of the present invention.
Figure 8B:
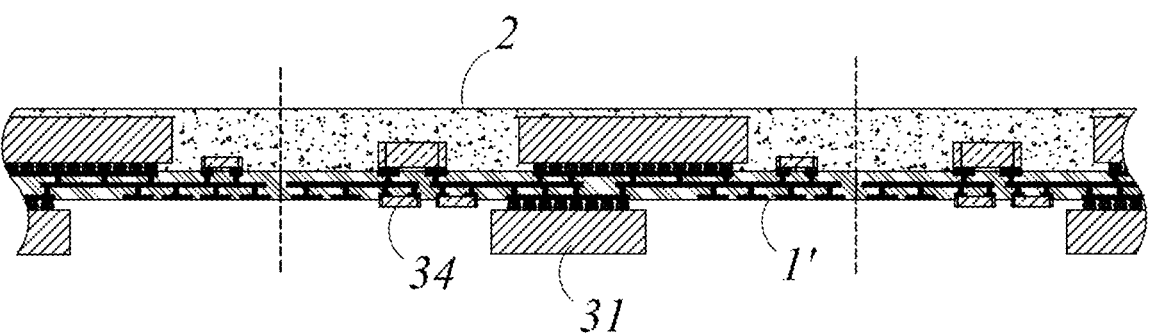

As shown in FIG. 7, the present invention further provides a manufacturing method of the double-sided SiP packaging structure, including the following steps:

S1: providing a substrate, wherein the substrate includes a plurality of substrate units 1', and forming a first packaging structure 2 on the upper surface of each substrate unit 1', as shown in FIG. 8A;

S2: providing a plurality of chips 31, and soldering a functional surface of at least one chip 31 on the lower surface of each substrate unit 1' by ball bonding, as shown in FIG. 8B;

S3: providing an interposer, wherein the interposer to be cut includes a plurality of interposer units 32', and a conductive bonding pad array 321 is arranged on the lower surface of each interposer unit 32'; and forming a groove 322 in a part of region between the conductive bonding pad array 321 and an edge contour of the interposer unit 32;

S4: manufacturing and forming a conductive structure array 35 on the upper surface of each interposer unit 32', and soldering the upper surface of the interposer to a part of region below the substrate 1 through the conductive structure array 35'; and S5: providing molding materials, filling a space region among the lower surface of the substrate 1, the chips 31 and the interposer with the molding materials, and forming a second packaging structure 3 on the lower surface of each substrate unit 1'.

Before the step S3, the method further includes a step of providing a plurality of passive elements 34, wherein the lower surface, provided with the passive element 34, of each substrate unit 1' depresses inwards to expose a conductive layer; and the passive elements 34 are arranged on the conductive layers and electrically connected with the substrate units, as shown in FIG. 8B.

Certainly, the sequence of mounting the passive elements 34 and the chips 31 is not limited in the present invention, and can be selected according to the actual manufacturing process.

The step S3 of providing an interposer, wherein the interposer includes a plurality of interposer units 32', and a conductive bonding pad array 321 is arranged on the lower surface of each interposer unit 32', and forming a groove 322 in a part of region between the conductive bonding pad array 321 and an edge contour of the interposer unit 32' specifically includes:

forming a groove 322 is in a region of lower surface of the interposer unit 32' between the conductive bonding pad array 321 and the edge contour of the interposer unit 32', wherein the groove 322 forms a square or annular structure around the conductive bonding pad array 321.

A plurality of stress release holes are further formed in a partial region of the interposer unit 32' outside the inner wall surface of the groove 322, so that the stress release holes are connected with the upper surface and the lower surface of the interposer unit 32'.

Figure 8C:
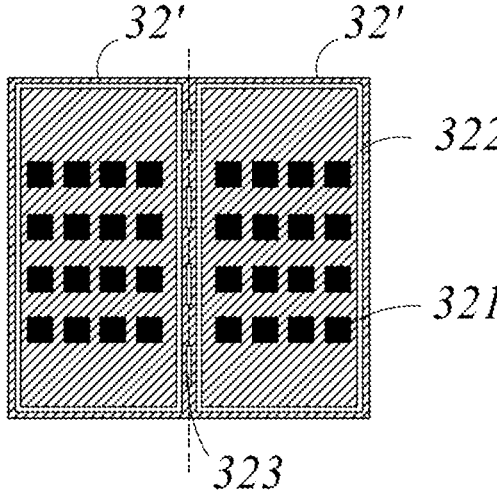

In an embodiment of the present invention, a plurality of interposers as shown in FIG. 8C are provided; each interposer includes two interposer units 32; a groove 322 is formed in the region between the conductive bonding pad array 321 on the lower surface of each interposer unit 32' and the edge contour of the interposer unit 32'; and the groove 322 forms a square or annular structure around the conductive bonding pad array 321.

Specifically, a plurality of stress release holes 323 are formed at the joint of two interposer units 32', so that each stress release hole 323 is connected with the upper surface and the lower surface of the interposer unit 32'. When the plurality of interposers are respectively mounted below the substrate 1, the stress release holes 323 can play a role of relieving the mounting stress of the interposers and avoid damaging the interposers in the mounting process.

Figure 8D:
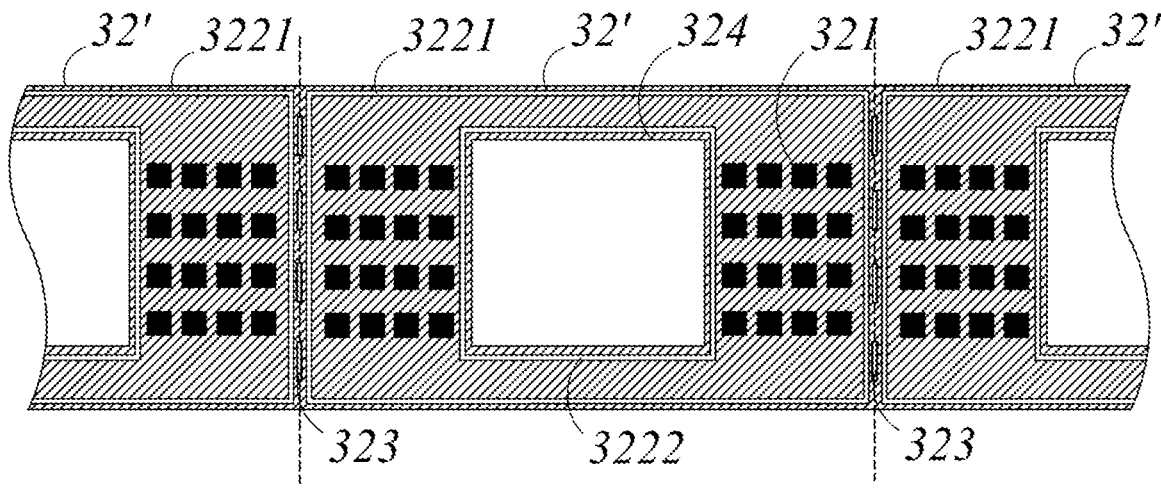

In another embodiment of the present invention, the interposer as shown in FIG. 8D is provided; and the interposer includes a plurality of interposer units 32'. In the present embodiment, the distribution and arrangement mode of the plurality of interposer units 32' can be designed according to the actual manufacturing process.

Specifically, an opening 324 is formed at a position in the interposer unit 32' corresponding to the chip.

More specifically, a first groove 3221 is formed in the region of lower surface of the interposer unit 32' between the conductive bonding pad array 321 and the edge contour of the interposer unit 32'; and a second groove 3222 is formed in the region of lower surface of the interposer unit 32' between the conductive bonding pad array 321 and the edge contour of the opening 324. The first groove 3221 and the second groove 3222 are respectively enclosed to form a square or annular structure.

A plurality of stress release holes 323 are formed at the joint of two adjacent interposer units 32'. In subsequent mounting processes, the whole interposer can be directly mounted below the substrate 1 as required to improve the mounting efficiency; and alternatively, the interposer can be cut first and mounted in blocks to reduce the mounting stress.

Figure 8E:
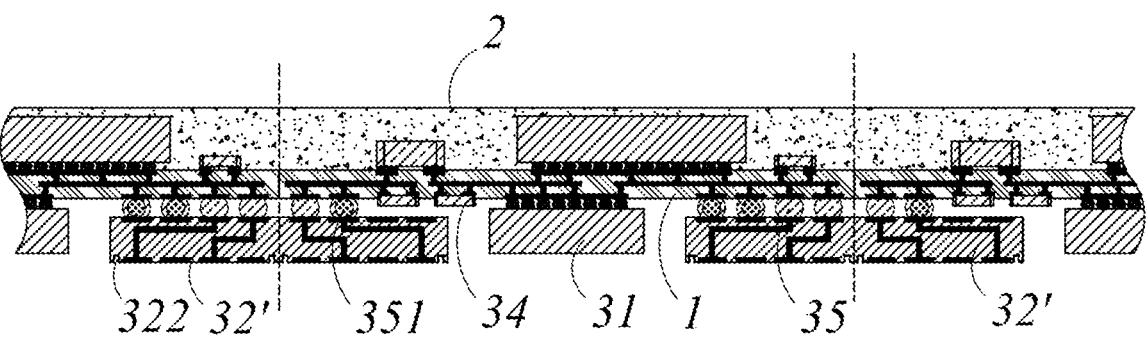

The step S4 of manufacturing and forming a conductive structure array 35 on the upper surface of each interposer unit 32', and solder bonding the upper surface of the interposer to a part of region below the substrate 1 through the conductive structure array 35' specifically includes:

as shown in FIG. 8E, manufacturing solder balls on the upper surface of each interposer unit 32' to form a conductive structure array 35. Certainly, the solder balls are not manufactured in the corresponding regions where the passive elements 34 are mounted, to prevent the interposer from pressing against the surface of the passive elements 34 when the solder balls are melted, and improve the reliability of products.

Specifically, structural supports 351 are arranged in part of solder balls; and a structural strength of the structural supports 351 is higher than that of the solder balls. In the subsequent molding process, the structural supports 351 can play a certain supporting role to prevent the interposer 32 from pressing against the passive elements 34 mounted on the lower surface of the substrate 1. Meanwhile, a height difference between the upper surface of the interposer 32 and the lower surface of the substrate 1 and a height difference between the lower surface of the interposer 32 and the lower surface of the chip 31 can be controlled and adjusted by adjusting a specific height of the structural supports 351.

In embodiments of the present invention, the structural supports 351 are copper core balls; and the copper core balls can play a certain shielding effect on RF signals by matching with copper pillars used for circuit conduction inside the interposer 32, thereby protecting the chips 31 from interference from other RF signals.

In the present invention, the specific number and arrangement mode of conductive structures with copper core balls are not specifically limited, and can be designed and adjusted according to the shielding effect required by actual products. For example, at least two conductive structures with the structural supports 351 (such as the copper core balls) can be arranged on both sides of each passive element 34, to enhance a supporting capacity of the conductive structure 35 near the passive element 34 and prevent the interposer 32 from pressing against the surface of the passive element 34; and at least one circle of conductive structure arrays 35 with the copper core balls can be arranged around the chips 31 or other devices with shielding requirements solder bonded on the lower surface of the substrate 1. If more than two circles of conductive structure arrays 35 with the copper core balls are arranged around the chips 31 or other devices with shielding requirements, every two adjacent circles of conductive structure arrays 35 with the copper core balls can be staggered at intervals to maximize the signal shielding effect.

Certainly, in other embodiments of the present invention, interposers with different dimensions can be mounted below each substrate unit according to actual product requirements. For example, a plurality of chips 31 with different performances are mounted on the lower surface of each substrate unit; and the copper core balls with the corresponding number and arrangement mode can be manufactured for each chip 31 according to actual signal shielding effect. However, since the substrate unit is constant in dimension, if more circles of conductive structure arrays 35 with the copper core balls need to be arranged in a certain region, the dimension of the conductive structure arrays 35 needs to be reduced; and meanwhile, the lower surface of each interposer in the packaging structure needs to be at the same height, so the thickness of each interposer can be adjusted according to the actual design requirements, to ensure that the lower surfaces of all interposers are at the same height.

Figure 8F:
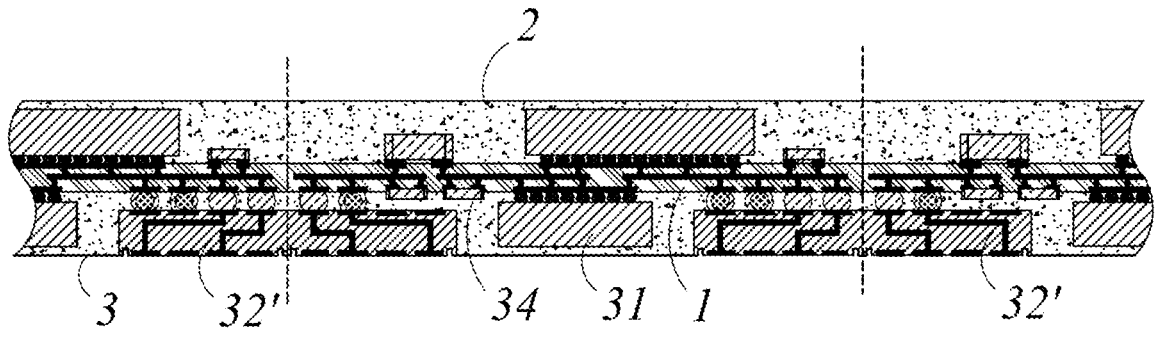

Further, as shown in FIG. 8F, the space region among the lower surface of the substrate 1, the chip 31 and the interposer is filled with the molding materials; and a second packaging structure 3 is formed on the lower surface of each substrate unit 1'.

Figure 8G:
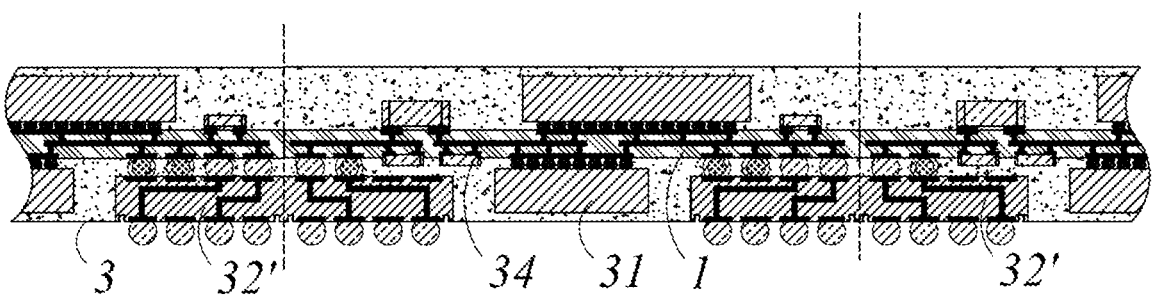
Figure 8H:
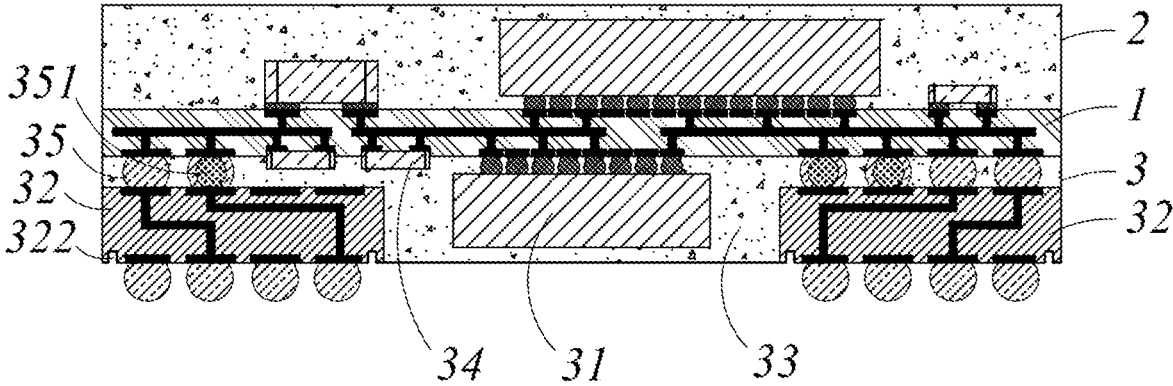

Further, the manufacturing method in the present embodiment further includes the following steps:

S6: manufacturing metal solder balls at the conductive bonding pad array on the lower surface of each adapter unit 32', as shown in FIG. 8G;

S7: cutting to form a packaging unit, wherein the packaging unit includes a substrate unit 1', a first packaging structure 2 and a second packaging structure 3, as shown in FIG. 8H; and S8: providing a circuit board 4, wherein the packaging unit is solder bonded on the upper surface of the circuit board 4 with the metal solder balls and electrically connected with the circuit board 4, to form the packaging structure as shown in FIG. 1.

In conclusion, according to the present invention, one groove is formed in a partial region of the lower surface of the interposer between the conductive bonding pad array on the lower surface of the interposer and the edge contour of the interposer, to prevent the molding materials from overflowing to the region of conductive bonding pad on the lower surface of the interposer in the molding process, and prevent the molding materials from polluting the region of conductive bonding pad on the lower surface of the interposer. The copper core balls are arranged in the conductive structures on the upper surface of the interposer, to not only adjust the space height between the interposer and the substrate by adjusting the height of the copper core balls according to the actual design, but also improve the supporting capacity of the conductive structure, thereby preventing the interposer from pressing against an electronic element mounted on the lower surface of the substrate. Meanwhile, the copper core balls arranged around the chips can play a certain shielding effect on RF signals by matching with copper pillars used for circuit conduction inside the substrate and the interposer, thereby protecting the chips from interference from other RF signals.

It should be understood that although the description is described according to the embodiments, every embodiment does not only contain one independent technical solution, and the narration mode of the description is only for the sake of clarity. Those skilled in the art should take the description as a whole; and the technical solutions in various embodiments can also be appropriately combined to form other embodiments that can be understood by those skilled in the art.

A series of detailed introductions listed above are only specific introductions for feasible embodiments of the present invention, and cannot be used to limit the scope of protection of the present invention. Any equivalent embodiment or change made without departing from the technical spirit of the present invention should fall within the scope of protection of the present invention.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A double-sided SiP packaging structure, comprising a substrate, a first packaging structure arranged on an upper surface of the substrate, and a second packaging structure arranged on a lower surface of the substrate, wherein the first packaging structure comprises at least one semiconductor element soldered on the upper surface of the substrate; the second packaging structure comprises at least one chip, at least one interposer and a molding material; the at least one chip is arranged below the substrate and electrically connected with the substrate; a conductive structure array is arranged on an upper surface of the at least one interposer; the at least one interposer is arranged in a part of region below the substrate with the conductive structure array; and a space region among the lower surface of the substrate, the at least one chip and the at least one interposer is filled with the molding material, wherein a conductive bonding pad array is arranged on a lower surface of the at least one interposer; and a groove is formed in a part of region between the conductive bonding pad array and an edge contour of the at least one interposer.

2. The double-sided SiP packaging structure according to claim 1, wherein the groove forms an annular structure around the conductive bonding pad array.

3. The double-sided SiP packaging structure according to claim 1, wherein the conductive structure array is an array composed of solder balls; structural supports are set inside of part of the solder balls; and a structural strength of the structural supports is higher than that of the solder balls.

4. The double-sided SiP packaging structure according to claim 3, wherein the structural supports are copper core balls.

5. The double-sided SiP packaging structure according to claim 4, wherein at least one circle of conductive structure arrays with the copper core balls is arranged around the at least one chip.

6. The double-sided SiP packaging structure according to claim 5, wherein every two adjacent circles of conductive structure arrays with the copper core balls are staggered at intervals when at least two circles of conductive structure arrays with the copper core balls are arranged around the at least one chip.

7. The double-sided SiP packaging structure according to claim 1, wherein the at least one interposer is two interposers; the at least one chip is a single chip; the two interposers are respectively arranged on both sides of the chip; the groove is arranged in a region between the conductive bonding pad array on the lower surface of each of the two interposers and an edge contour of each of the two interposers; and the groove forms an annular structure around the conductive bonding pad array.

8. The double-sided SiP packaging structure according to claim 1, wherein the at least one interposer is an interposer; the at least one chip is a single chip; an opening is arranged in the interposer; the chip is arranged in the opening; a first groove is formed in a region between the conductive bonding pad array and an outer edge contour of the interposer; a second groove is formed in a region between the conductive bonding pad array and the edge contour of the opening; and the first groove and the second groove are respectively enclosed to form an annular structure.

9. The double-sided SiP packaging structure according to claim 1, wherein the second packaging structure further comprises a plurality of passive elements arranged on the lower surface of the substrate; the lower surface, provided with the plurality of passive elements, of the substrate depresses inwards to expose a conductive layer; and the plurality of passive elements are arranged on the conductive layer.

10. The double-sided SiP packaging structure according to claim 1, wherein a lower surface of the at least one chip and the lower surface of the at least one interposer are located at a same level; and the molding material exposes the lower surface of the at least one chip.

11. The double-sided SiP packaging structure according to claim 1, wherein the at least one chip is two chips; and a first chip is arranged on the lower surface of the substrate and a second chip is arranged on a lower surface of the first chip.

12. The double-sided SiP packaging structure according to claim 1, wherein the double-sided SiP packaging structure further comprises a circuit board; and the conductive bonding pad array on the lower surface of the at least one interposer is arranged on an upper surface of the circuit board through metal solder balls and electrically connected with the circuit board.

13. A manufacturing method of the double-sided SiP packaging structure, comprising the following steps:

S1: providing a substrate, wherein the substrate comprises a plurality of substrate units, and forming a first packaging structure on an upper surface of each substrate unit;

S2: providing a plurality of chips, and a functional surface of at least one chip of the plurality of chips bonded on a lower surface of each substrate unit with solder balls;

S3: providing at least one interposer, wherein the at least one interposer comprises a plurality of interposer units, and a conductive bonding pad array is arranged on a lower surface of each of the plurality of interposer units; and forming a groove in a part of region between the conductive bonding pad array and an edge contour of each of the plurality of the interposer units;

S4: manufacturing and forming a conductive structure array on an upper surface of each of the plurality of interposer units, and an upper surface of the at least one interposer bonded to a part of region below the substrate with the conductive structure array; and S5: providing molding materials, filling a space region among a lower surface of the substrate, the plurality of chips and the at least one interposer with the molding materials, and forming a second packaging structure on the lower surface of each substrate unit.

14. The manufacturing method of the double-sided SiP packaging structure according to claim 13, wherein the step of forming a groove specifically comprises:

forming an annular groove around the conductive bonding pad array.

15. The manufacturing method of the double-sided SiP packaging structure according to claim 13, wherein the step S4 specifically comprises:

manufacturing solder balls on the upper surface of each of the plurality of interposer units to form the conductive structure array; and setting structural supports inside of part of the solder balls, wherein a structural strength of the structural supports is higher than that of the solder balls; the structural supports are copper core balls.

16. The manufacturing method of the double-sided SiP packaging structure according to claim 15, wherein the step of setting the structural supports specifically comprises:

manufacturing at least one circle of conductive structure arrays around the at least one chip of the plurality of chips with copper core balls, wherein every two adjacent circles of conductive structure arrays with the copper core balls are staggered at intervals when the copper core balls are manufactured in at least two circles of conductive structure arrays around the at least one chip of the plurality of chips.

17. The manufacturing method of the double-sided SiP packaging structure according to claim 16, wherein the step S3 specifically comprises:

the at least one interposer is a plurality of interposers, wherein the plurality of interposers comprises two interposer units;

forming the groove in a region between the conductive bonding pad array on the lower surface of each of the two interposer units and an edge contour of each of the two interposer units, wherein the groove forms an annular structure around the conductive bonding pad array; and forming a plurality of stress release holes at a joint of the two interposer units, wherein the stress release holes are connected with the upper surfaces and the lower surfaces of the two interposer units.

18. The manufacturing method of the double-sided SiP packaging structure according to claim 16, wherein the step S3 specifically comprises:

the at least one interposer is a single interposer, wherein the interposer comprises the plurality of interposer units, and openings are formed at positions in the plurality of interposer units corresponding to the plurality of chips;

forming a first groove in a region between the conductive bonding pad array and the edge contour of each of the plurality of interposer units, and forming a second groove in a region between the conductive bonding pad array and the edge contour of each opening, wherein the first groove and the second groove are respectively enclosed to form an annular structure; and forming a plurality of stress release holes at a joint of two adjacent interposer units of the plurality of adjacent interposer cutting units, wherein the stress release holes are connected with the upper surfaces and the lower surfaces of the plurality of interposer units.

19. The manufacturing method of the double-sided SiP packaging structure according to claim 13, further comprising the following step before the step S3:

providing a plurality of passive elements, wherein the lower surface, provided with the plurality of passive element, of each substrate unit depresses inwards to expose a conductive layer, and the plurality of passive elements are arranged on the conductive layers and electrically connected with the substrate units.

20. The manufacturing method of the double-sided SiP packaging structure according to claim 13, further comprising the following steps:

manufacturing metal solder balls at the conductive bonding pad array;

cutting to form a packaging unit, wherein the packaging unit comprises the substrate unit, the first packaging structure and the second packaging structure; and providing a circuit board, wherein the packaging unit is soldered on an upper surface of the circuit board with the metal solder balls and electrically connected with the circuit board.

* * * * *